(12) United States Patent
Staton

(10) Patent No.: US 8,410,783 B2
(45) Date of Patent: Apr. 2, 2013

(54) DETECTING AN END OF LIFE FOR A BATTERY USING A DIFFERENCE BETWEEN AN UNLOADED BATTERY VOLTAGE AND A LOADED BATTERY VOLTAGE

(75) Inventor: Kenneth L. Staton, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 707 days.

(21) Appl. No.: 12/570,622

(22) Filed: Sep. 30, 2009

(65) Prior Publication Data

US 2011/0074434 A1   Mar. 31, 2011

(51) Int. Cl.
*G01N 27/416* (2006.01)
(52) U.S. Cl. .................. 324/433; 324/429; 320/DIG. 21
(58) Field of Classification Search .................. 320/136, 320/DIG. 21; 324/433, 429; 307/66; 340/636.15, 340/636.16
See application file for complete search history.

(56) References Cited

U.S. PATENT DOCUMENTS

| | | | |
|---|---|---|---|
| 3,626,408 A | 12/1971 | Carbrey | |
| 3,899,732 A * | 8/1975 | Staby | 324/429 |
| 4,101,787 A | 7/1978 | Vail | |
| 4,149,162 A | 4/1979 | Enemark et al. | |
| 4,413,221 A | 11/1983 | Benjamin et al. | |
| 4,423,379 A | 12/1983 | Jacobs et al. | |
| 5,036,284 A | 7/1991 | Cichanski | |
| 5,061,898 A | 10/1991 | Oram et al. | |
| 5,185,565 A | 2/1993 | Uchida | |
| 5,268,845 A | 12/1993 | Startup et al. | |
| 5,438,270 A | 8/1995 | Harper et al. | |
| 5,477,132 A | 12/1995 | Canter et al. | |
| 5,504,415 A | 4/1996 | Podrazhansky et al. | |
| 5,572,136 A * | 11/1996 | Champlin | 324/426 |
| 5,623,210 A | 4/1997 | Sakamoto | |
| 5,640,079 A | 6/1997 | Nelson et al. | |
| 5,684,686 A | 11/1997 | Reddy | |
| 5,710,504 A | 1/1998 | Pascual et al. | |
| 5,831,351 A | 11/1998 | Kohosrowpour et al. | |
| 5,852,557 A | 12/1998 | Woodward | |
| 5,912,552 A | 6/1999 | Tateishi | |
| 5,939,864 A | 8/1999 | Lenhart et al. | |
| 6,008,629 A | 12/1999 | Saeki et al. | |
| 6,057,666 A | 5/2000 | Dougherty et al. | |

(Continued)

FOREIGN PATENT DOCUMENTS

| | | |
|---|---|---|
| DE | 19504468 | 8/1995 |
| EP | 1961621 | 8/2008 |

(Continued)

*Primary Examiner* — Jay Patidar
(74) *Attorney, Agent, or Firm* — Park, Vaughan, Fleming & Dowler LLP

(57) ABSTRACT

One particular implementation conforming to aspects of the present invention takes the form of a method for detecting the end of life of a battery for an electronic device. The method may include calculating the voltage of the battery in an unloaded state, holding the sampled unloaded battery voltage, measuring a loaded battery voltage, calculating the difference between the unloaded and loaded battery voltages and amplifying the calculated difference. Other implementations may take the form of a circuit to perform one or more of the operations of the above method. The circuit may include a sample and hold section and a differential amplifier to provide the amplified difference to a microcontroller for analysis. The microcontroller may also provide a warning or indication to the device or to a user of the device when the battery nears the end of life.

10 Claims, 7 Drawing Sheets

U.S. PATENT DOCUMENTS

| | | | |
|---|---|---|---|
| 6,061,638 A | 5/2000 | Joyce |
| 6,064,187 A | 5/2000 | Redl et al. |
| 6,067,241 A | 5/2000 | Lu |
| 6,144,194 A | 11/2000 | Varga |
| 6,229,293 B1 | 5/2001 | Farrenkopf |
| 6,268,711 B1 | 7/2001 | Bearfield |
| 6,307,378 B1 | 10/2001 | Kozlowski |
| 6,313,636 B1 | 11/2001 | Pohl et al. |
| 6,323,627 B1 | 11/2001 | Schmiederer et al. |
| 6,326,774 B1 | 12/2001 | Mueller et al. |
| 6,331,365 B1 | 12/2001 | King |
| 6,337,560 B1 | 1/2002 | Kalogeropoulos et al. |
| 6,366,070 B1 | 4/2002 | Cooke et al. |
| 6,400,123 B1 | 6/2002 | Bean et al. |
| 6,507,168 B1 | 1/2003 | Matsuda et al. |
| 6,534,993 B2 | 3/2003 | Bertness |
| 6,548,755 B2 | 4/2003 | Wu |
| 6,583,606 B2 | 6/2003 | Koike et al. |
| 6,661,116 B1 | 12/2003 | Seto |
| 6,677,734 B2 | 1/2004 | Rothleitner et al. |
| 6,683,441 B2 | 1/2004 | Schiff et al. |
| 6,762,563 B2 | 7/2004 | St. Germain et al. |
| 6,771,046 B2 | 8/2004 | Ariga et al. |
| 6,809,504 B2 | 10/2004 | Tang et al. |
| 6,836,157 B2 | 12/2004 | Rader et al. |
| 6,914,412 B2 | 7/2005 | Wang et al. |
| 6,947,178 B2 | 9/2005 | Kuo et al. |
| 6,980,912 B2 | 12/2005 | Patino et al. |
| 7,012,402 B2 | 3/2006 | Miller et al. |
| 7,078,908 B2 | 7/2006 | Fujita et al. |
| 7,157,888 B2 | 1/2007 | Chen et al. |
| 7,191,077 B2 | 3/2007 | Mese et al. |
| 7,216,044 B2 | 5/2007 | Kato et al. |
| 7,242,169 B2 | 7/2007 | Kanamori et al. |
| 7,259,538 B2 | 8/2007 | Melton et al. |
| 7,266,001 B1 | 9/2007 | Notohamiprodjo et al. |
| 7,274,112 B2 | 9/2007 | Hjort et al. |
| 7,282,891 B2 | 10/2007 | Smallwood et al. |
| 7,388,349 B2 | 6/2008 | Elder et al. |
| 7,505,856 B2 * | 3/2009 | Restaino et al. ............ 702/63 |
| 7,570,015 B2 | 8/2009 | Bansal et al. |
| 7,598,711 B2 | 10/2009 | Krah et al. |
| 7,646,620 B2 | 1/2010 | MacDonald et al. |
| 7,688,029 B2 | 3/2010 | Hoffman |
| 7,702,178 B2 | 4/2010 | Bergen et al. |
| 2003/0015993 A1 | 1/2003 | Misra et al. |
| 2005/0077875 A1 | 4/2005 | Bohley |
| 2005/0258941 A1 | 11/2005 | Berard |
| 2005/0266300 A1 | 12/2005 | Lamoreux et al. |
| 2006/0174141 A1 | 8/2006 | Chang |
| 2007/0091187 A1 | 4/2007 | Lin |
| 2008/0090133 A1 | 4/2008 | Lim et al. |
| 2009/0059255 A1 | 3/2009 | Ohide |
| 2009/0208824 A1 | 8/2009 | Greening et al. |
| 2009/0261653 A1 | 10/2009 | Furukawa et al. |
| 2009/0289603 A1 | 11/2009 | Mahowald |
| 2009/0309552 A1 | 12/2009 | Krah et al. |
| 2009/0315411 A1 | 12/2009 | Depew |
| 2010/0027906 A1 | 2/2010 | Hara et al. |
| 2011/0074360 A1 | 3/2011 | Kerr et al. |

FOREIGN PATENT DOCUMENTS

| | | |
|---|---|---|
| FR | 2090074 | 1/1972 |
| GB | 2046923 | 11/1980 |
| GB | 2275118 | 8/1994 |
| WO | WO2008/075358 | 6/2008 |

* cited by examiner

DETECTING AN END OF LIFE FOR A BATTERY USING A DIFFERENCE BETWEEN AN UNLOADED BATTERY VOLTAGE AND A LOADED BATTERY VOLTAGE

TECHNICAL FIELD

This invention relates generally to batteries in electronic devices, and more specifically to methods and circuits for detecting the end of the life of a battery powering an electronic device.

BACKGROUND

Many portable electronic devices include rechargeable batteries. However, depending on the power consumption of the electronic device, the battery may need to be periodically recharged so that the device may continue to operate uninterrupted. For example, laptop computers often include a battery that powers the device when a traditional power source is not available, but may often only operate for a limited time before the battery must be recharged. Thus, it is useful if a portable electronic device provides some indication to the user of the battery status so that the user may recharge the battery before loss of power. This is especially useful in situations where data may be lost due to a power failure, such as a laptop computer or other portable computing device.

An additional concern is that, although batteries may be refreshed by charging, virtually all batteries suffer degradation over time such that the battery can no longer provide the necessary power to the device even when charged. For example, a typical nickel-metal hydride (NiMH) battery can generally be recharged about 1,000 times before the battery has degraded to a point that it can no longer provide the necessary power to the device. Thus, batteries for electronic devices are typically replaced with new batteries once the performance of the battery degrades. However, in some situations, acquiring a replacement battery for the electronic device may take several days or weeks as the new battery must be obtained from a manufacturer of the device. In situations where data may be lost or usage of the device may be interrupted due to the degraded battery, a user may wish that the electronic device provide an indication to the user that the battery is nearing the end of the battery's life. Ideally, this indication is provided to the user with enough time to allow the user to locate and purchase a replacement battery before any negative effects are realized, such as loss of information or ability to use the device in a portable manner.

SUMMARY

In many electronic devices, the apparatuses utilized to detect an imminent end to a battery's life are typically complex and often utilize expensive components. Thus, what is needed is a simple method and circuit to detect the end of life of a battery such that a portable electronic device may provide advanced warning to a user of the device of the degradation of the device's battery such that the user may obtain a replacement battery for the device before any negative effects are realized. Further, some battery chemistries, such as NiMH batteries, have a nearly constant internal resistance until very near the end of life of the battery, making detecting of the degradation of the battery charge difficult. Thus, what is also needed is a method and circuit that amplifies the measured difference in internal resistance of the battery as the battery nears the end of life to provide a more accurate indication of the battery's status.

One embodiment may take the form of a circuit for detecting an imminent end of life of a battery powering an electronic device. The circuit may include a first node electrically connected to a battery and a load, such that the load is configured to be applied and removed from the circuit. A sample and hold circuit may also be electrically connected to the first node with the sample and hold circuit configured to sample and hold an unloaded battery voltage. A differential amplifier electrically may also be included in the circuit, connected to the sample and hold circuit, with the differential amplifier configured to calculate and amplify a difference between the sampled unloaded battery voltage and a loaded battery voltage.

Another embodiment may take the form of a method for detecting the end of the life of a battery powering an electronic device. The method may include the operations of sampling a voltage of a battery while the battery is unloaded, storing the sampled unloaded battery voltage, measuring a voltage of the battery while a load is applied to the battery, calculating a difference between the sampled unloaded battery voltage and the measured loaded battery voltage and amplifying the calculated difference using a differential amplifier circuit. The method may also include comparing the amplified difference to a predetermined value to detect the end of the life of the battery.

Still another embodiment may take the form of a system for detecting the end of the life of a battery powering an electronic device. The system may include a sample and hold circuit configured to sample the unloaded voltage of a battery and a differential amplifier circuit configured to receive the sampled unloaded battery voltage from the sample and hold circuit and calculate and amplify a difference between the sampled unloaded battery voltage and a loaded battery voltage. The system may also include a microcontroller configured to receive the amplified difference from the differential amplifier and compare the amplified difference with a predetermined threshold value.

DETAILED DESCRIPTION OF THE INVENTION

One particular implementation conforming to aspects of the present invention takes the form of a method for detecting the end of life of a battery for an electronic device. The method may include calculating the voltage of the battery in an unloaded state, holding the sampled unloaded battery voltage, measuring a loaded battery voltage, calculating the difference between the unloaded and loaded battery voltages and amplifying the calculated difference. Other implementations may take the form of a circuit to perform one or more of the operations of the above method. For example, such a circuit may include a sample and hold section and a differential amplifier to provide the amplified difference to a microcontroller for analysis. The microcontroller may also provide a warning or indication to the device or to a user of the device when the battery nears the end of life.

Figure 1:
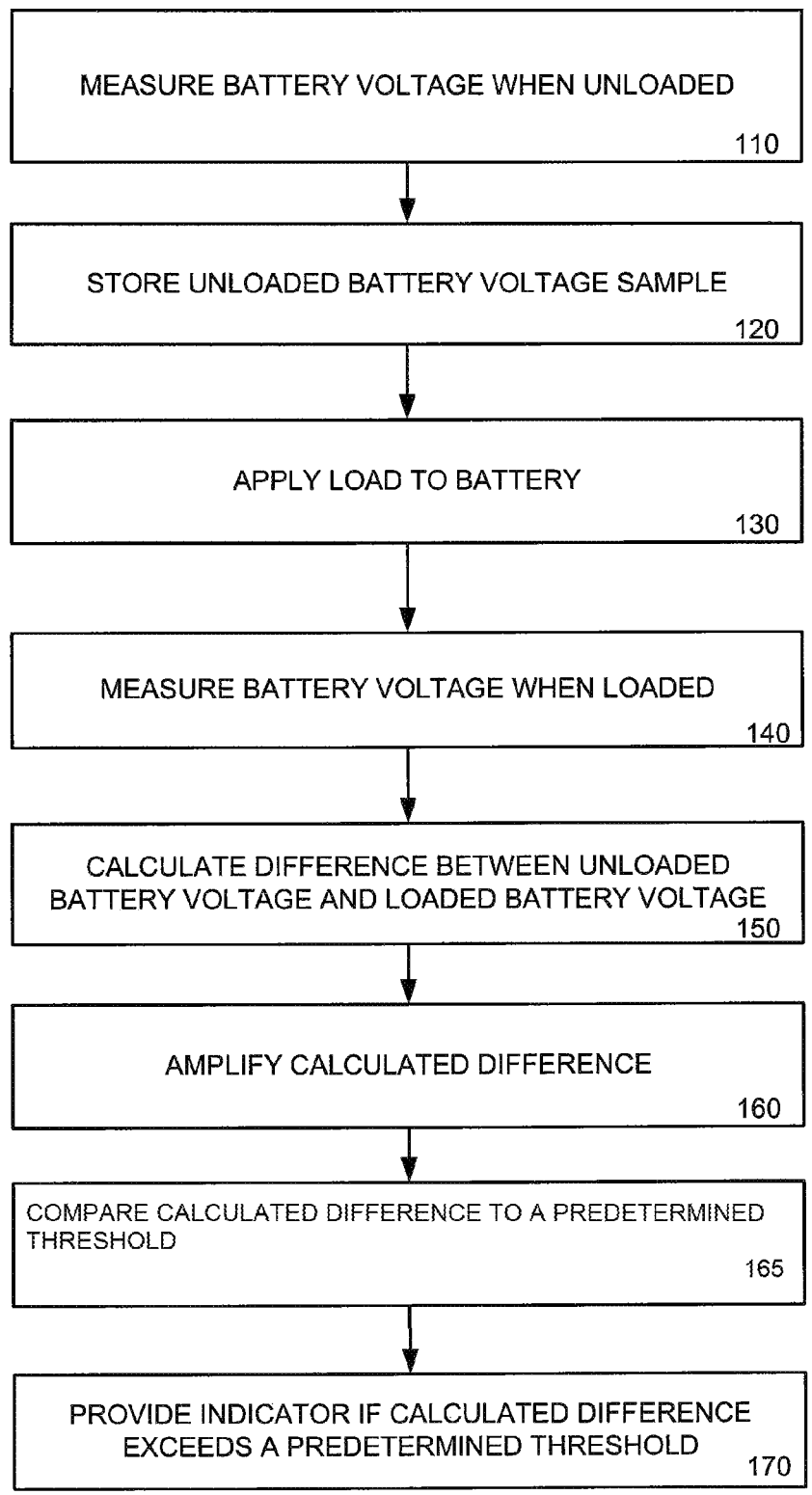
FIG. 1 is a flow chart showing a method for determining the end of life of a battery.

FIG. 1 is a flow chart showing a method for determining the end of life of a battery. In one embodiment, a microcontroller, microprocessor, or other processing device of an electronic device may perform the operations of the method. In another embodiment, an end of battery life detection circuit may perform the operations. In still other embodiments, the operations of the method may be performed by a combination of an end of battery life detection circuit and a microcontroller, as explained in more detail below. Generally, any device including a battery may include components to perform the method to detect the end of life of the battery. As explained in more detail below with reference to the circuits of FIGS. 2-4, the microcontroller may perform the operations of the method by providing an enable signal, and other signals, to a circuit. Further, the microcontroller may receive the output of certain circuits or devices, including those described herein, to perform other operations of the method.

Beginning in operation 110, the microcontroller or circuit may measure the voltage provided by the battery when no load is present ("the unloaded voltage"). In one particular embodiment, the microcontroller may provide an enable signal to a sample and hold circuit described below with reference to FIG. 3 to make the unloaded voltage measurement. In other embodiments, the unloaded voltage measurement may be automatically performed through a sample and hold or active peak detector circuit without receiving an enable signal.

Once measured, the unloaded voltage may be stored in operation 120. In one embodiment, a sample and hold circuit may maintain the unloaded voltage such that the value is stored within the circuit that performs the voltage measurement. In another embodiment, the microcontroller may store the measured unloaded voltage in a machine readable medium. A machine readable medium includes any mechanism for storing or transmitting information in a form (e.g., data, software, processing application) readable by a machine (e.g., a computer). Common forms of machine-readable media may include, but is not limited to, magnetic storage media (e.g., floppy diskette); optical storage media (e.g., CD-ROM); magneto-optical storage media; read only memory (ROM); random access memory (RAM); erasable programmable memory (e.g., EPROM and EEPROM); flash memory; or other types of media suitable for storing electronic instructions.

After the unloaded voltage level of the battery has been measured and stored, the microcontroller may apply a load to the battery in operation 130. The load may be applied through a load signal provided by the microcontroller. In one embodiment, the microcontroller may apply a resistance to the circuit through the load signal. Generally, any means to apply a load to a circuit may be utilized by the microcontroller to supply the load signal. Once loaded, the microcontroller or circuit may take a second voltage measurement of the battery in operation 140, this time with the load applied to the battery. This value may also be stored in a similar manner as described above.

Once both the loaded and unloaded voltage levels are measured, a difference between the two values may be calculated in operation 150. As explained in more detail below, a differential amplifier may be utilized to determine the difference in the voltage values. Alternatively, the microcontroller may access the stored voltage values and perform the difference operation. Further, as explained in greater detail below, the calculated difference may be amplified in operation 160. Again, similar to the differential measurement, a differential amplifier of an end of life detection circuit may amplify the measured difference.

Generally, the calculated difference measurement between the loaded and unloaded battery is a function of the state of charge of the battery. As the measured difference increases due to prolonged usage of the battery, the battery may provide less power to the device. Thus, the measured difference may provide to the device an estimate of the degradation of the battery at any given moment. However, a pure difference measurement may not provide an accurate estimation of the end of life of the battery. For example, for alkaline batteries, the measured cell potential can be utilized directly to warn the device of a low battery condition. However, because the internal resistance of a NiMH battery is 5 to 10 times smaller than that of an alkaline battery, the measured difference may be amplified through an amplification circuit in operation 160 to aid the device in determining the end of life of the battery.

Figure 2:
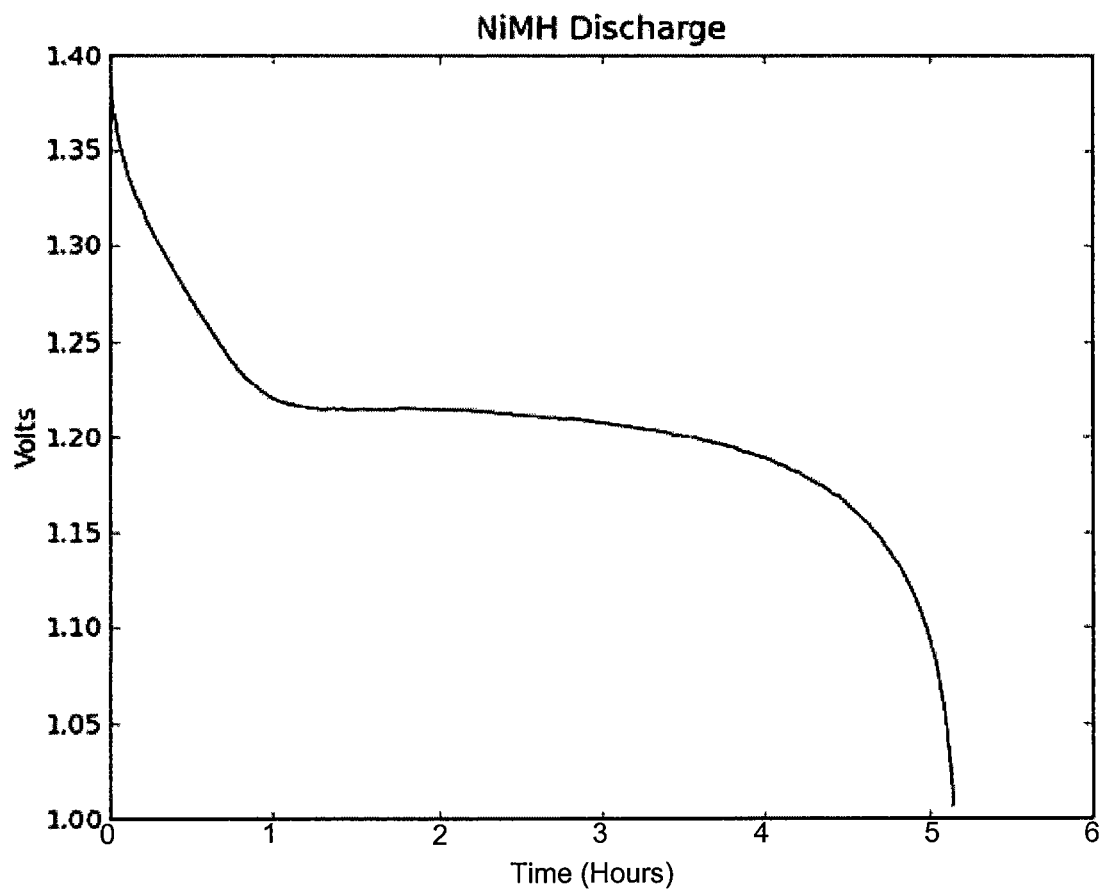
FIG. 2 depicts a graph of the change in potential voltage of a battery as the battery degrades due to usage.

Amplifying the measured difference in operation 160 may also aid in determining the end of a battery life of batteries for varying chemistries and discharge rates. As stated above, NiMH batteries have a very low internal resistance until very near the end of life of the battery, making detection of the degradation of the battery difficult. FIG. 2 depicts a graph of the change in potential voltage of a NiMH battery as the battery degrades due to usage. The y-axis of the graph indicates the voltage provided by the battery while the x-axis is the elapsed time as the battery goes through a life cycle. Thus, as shown, continual usage of the battery (moving along the x-axis) degrades the amount of voltage the battery provides, from near 1.40 volts at the beginning of the life cycle of the battery to 1.00 volts near 5 hours of usage. At 1.00 volts, the battery may need to be replaced as it may no longer provide enough power to the electronic device.

As shown in the graph, the discharge rate of the battery is relatively steep for the first part of the life cycle of the battery. However, for the majority of the rest of the battery life cycle, the battery potential remains relatively flat, as shown on the graph of FIG. 2 in the area between 1 hour and 4.5 hours. Thus, a NiMH battery at 50% degradation provides only slightly more electric potential than the same battery at 75% degradation. As a result, it may be difficult to accurately measure the un-amplified difference in the loaded and unloaded battery voltage as the battery degrades during the life cycle. By the time that a measurable difference is detected by the device, the battery may only have a small charge left to support the device.

To account for the relatively flat discharge curve of the NiMH battery, the measured difference between the loaded and unloaded battery voltage is amplified in operation 160. By amplifying the measured difference, small changes in the internal resistance of the NiMH battery due to degradation may be measured more accurately, so that the electronic device may be able to better estimate the end of life of the battery. This amplification may provide a more accurate measurement of changes within the battery in the flat portion of the discharge curve of FIG. 2, so that an indication of the end of the battery life may be provided to the device or the user before any negative effects of battery failure are realized. For example, a 300 mV sag in the potential of the battery may be amplified to 1.25 V, such that the device may better detect the change in battery potential.

Returning to FIG. 1, the microcontroller may analyze the amplified difference in operation 165 to determine if the difference falls above a predetermined threshold value. Prior to analysis by the microcontroller, the amplified difference may be digitized using an analog to digital converter 332. Once received, the microcontroller may compare the received value to the predetermined level. If the received value is above the threshold, the battery potential may be degraded to a point such that the end of life of the battery may be near. Thus, an indication may be provided to the device or to a user to indicate that the battery is near the end of life in operation 170. As should be appreciated, the threshold value that triggers the warning may be set either by the device itself or a user of the device. Generally, any value that indicates to the device or user that the battery is near end of life may be used as the threshold value.

Figure 3:
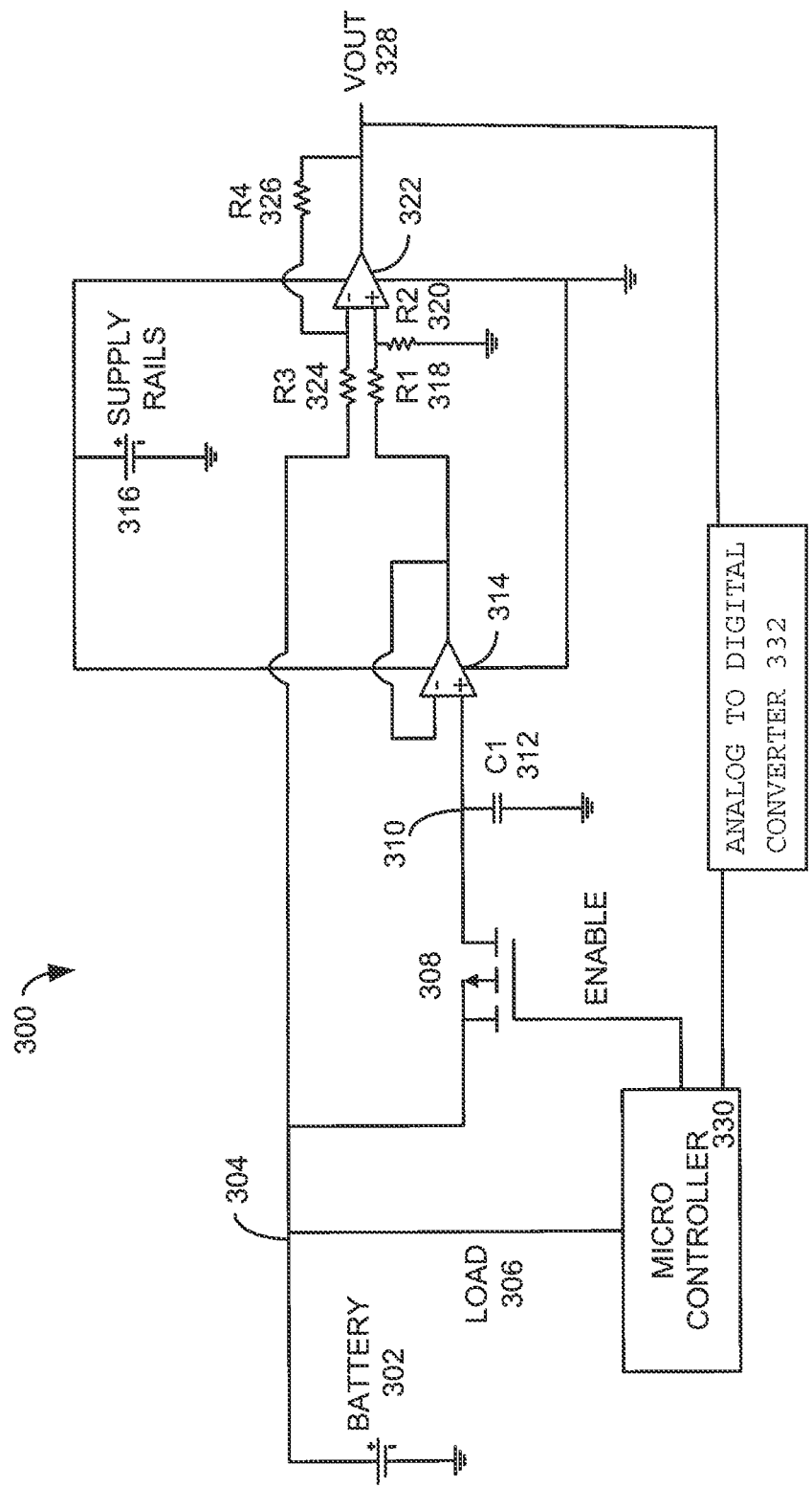
FIG. 3 depicts a first embodiment for a end of life battery detection circuit.

FIG. 3 depicts a first embodiment of a circuit that may detect the end of life of a battery. As explained above, the circuit may be used in conjunction with a microcontroller 330 of an electronic device to detect when a battery nears the end of its life.

The circuit 300 depicted in FIG. 3 may be connected to a battery 302 of an electronic device. The power supply 316 depicted in FIG. 3 represents the input from the battery of the device that is sampled or any other power source of the device. The battery 302 is connected to a first node 304 of the circuit 300. A load 306 is also connected to the first node 304. As explained in more detail below, the load 306 is applied to the battery by a microcontroller of the device to obtain a loaded and unloaded battery voltage.

A field-effect transistor (FET) device 308 is also connected to the first node 304 of the circuit 300. Generally speaking, the FET device 308 is a p-channel metal oxide semiconductor field-effect transistor, or p-channel "MOSFET." It should be noted that alternative embodiments may use a n-channel MOSFET, depletion mode MOSFET, and so on. The FET device 308 may have four terminals, namely a gate, a drain, a source and a body. The source and body terminals may be electrically connected to the first node 304. The gate terminal may be electrically connected to the microcontroller or similar component of the device such that the FET 308 may operate as a switch controlled by an enable signal provided by the microcontroller. The drain terminal may be connected electrically connected to a second node 310 of the circuit 300. Also connected to the second node 310 may be one end of a capacitor 312, with the other end of the capacitor connected to ground. As should be noted, the value of the capacitor may vary as desired by the circuit designer depending on the operating parameters of the circuit's components.

A first operational amplifier (OPAMP) device 314 may also be connected to the second node 310. More precisely, the non-inverting input of the OPAMP 314 may be connected to the second node 310. The OPAMP may also include an inverting input, a positive and negative power supply input and an output. As shown in FIG. 3, the negative power supply input of the first OPAMP 314 is connected to ground while the positive power supply input is provided by the supply rails 316 of the electronic device, e.g., generally provided by the battery 302. However, the power supplied to the OPAMPs of the circuit 300 may be provided by any power source of the device. The output of the first OPAMP 314 is fed back to the inverting input.

The output of the first OPAMP 314 may also be a first input to a differential amplifier section of the circuit 300 that is configured to determine the difference in voltage between a loaded and unloaded battery. Thus, the output of the first OPAMP 314 is connected in series with one end of a first resistor 318, with the other end of the first resistor connected to the non-inverting input of a second OPAMP 322. A second resistor 320 is connected between the non-inverting input of the second OPAMP 322 and ground. Also, the negative power supply input of the second OPAMP 322 is connected to ground while the positive power supply input is provided by the supply rails 316 of the device.

Other resistors may also be included in the differential amplifier circuit. A third resistor 324 may electrically connect on one end to the inverting input of the second OPAMP 322. The other end of the third resistor 324 may be connected to the first node 304. Also, a fourth resistor 326 may be connected between the output of the second OPAMP 322 and the inverting input in the feedback loop of the amplifier. As should be noted, the values of the four resistors may vary as desired by the circuit 300 designer to control the amplification of the differential amplifier section of the circuit.

Figure 4:
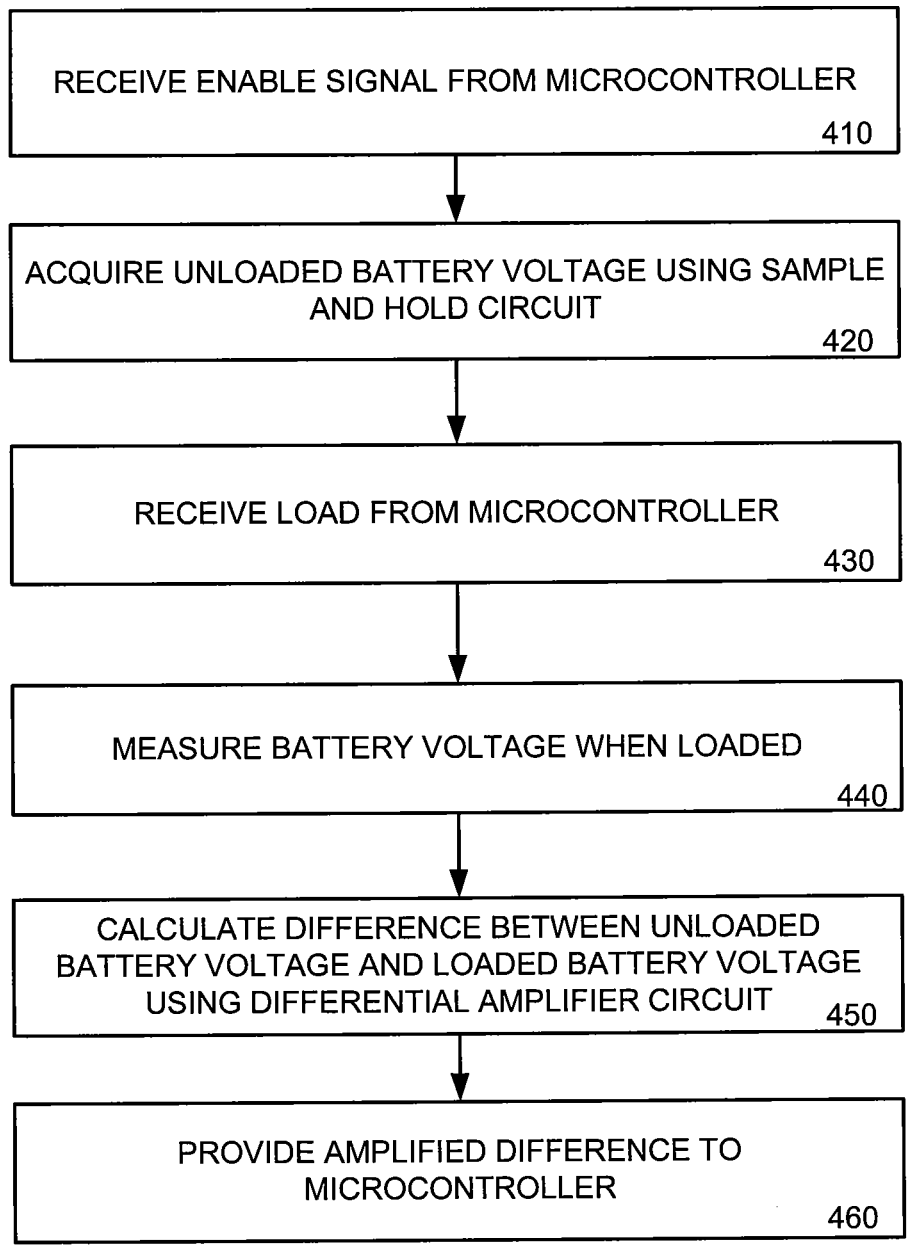
FIG. 4 is a flow chart showing a method for acquiring a voltage difference of a battery in a loaded and unloaded state utilizing the first embodiment.

FIG. 4 is a flowchart showing a method for acquiring a voltage difference of a battery in a loaded and unloaded state utilizing the circuit described above with reference to FIG. 3. The operations of the flowchart may be performed by the circuit 300.

First, in operation 410, the microcontroller 330 may provide an enable signal to the FET device 308 of the circuit to activate the end of life battery detection. Once activated, the first capacitor 312 and the first OPAMP 314 may act as a sample and hold circuit to measure and hold the voltage of the unloaded battery 302 in operation 420. Thus, once enabled, the capacitor 312 may charge to the measured voltage of the unloaded battery. This value may be held by the sample and hold section of the detection circuit 300 and provided as an unloaded battery voltage input to the differential amplifier section of the circuit.

In operation 430, the microprocessor 330 may provide a load to the battery 302 at the load input 306 of the circuit 300. As a load is applied to the battery, the voltage provided by the loaded battery may be read at the inverting input to the second OPAMP 322 through the third resistor 324 in operation 440. This value may be provided to the differential amplifier section of the circuit 300 as a loaded battery voltage. The differential amplifier may then calculate and amplify the difference between the loaded and unloaded voltages in operation 450. As should be appreciated, the values of the resistors of the circuit 300 may be selected by the circuit designer to set the amplification of the difference as needed. The circuit 300 may then provide the amplified difference between the loaded and unloaded battery to the microprocessor 330 at the Vout 328 of the circuit 300 in operation 460. This information may be digitized with an analog to digital converter 332 and used by the microprocessor 330 to determine if the battery is near the end of life as explained above.

In another embodiment, a reference voltage may be provided to the circuit 300 to represent the unloaded battery potential. For example, the FET device 308 and the capacitor 312 may be removed from the circuit 300 and replaced with a reference voltage, optionally provided by the microcontroller 350. This reference voltage may provide a baseline voltage from which the difference in loaded and unloaded battery potential is calculated. Thus, the reference voltage may be a value that approximates the unloaded battery voltage. In this particular embodiment, the reference voltage may be provided directly to the differential amplifier section of the circuit 300. A load may be placed on the battery by the microcontroller 350 in a similar manner as described above. When loaded, the battery voltage may be measured and provided to the differential amplifier as the loaded battery voltage so that the output of the circuit 300 would provide the amplified difference between the loaded battery voltage and the reference voltage provided. In this manner, the reference voltage substitutes as the unloaded battery voltage for the circuit 300.

Figure 5:
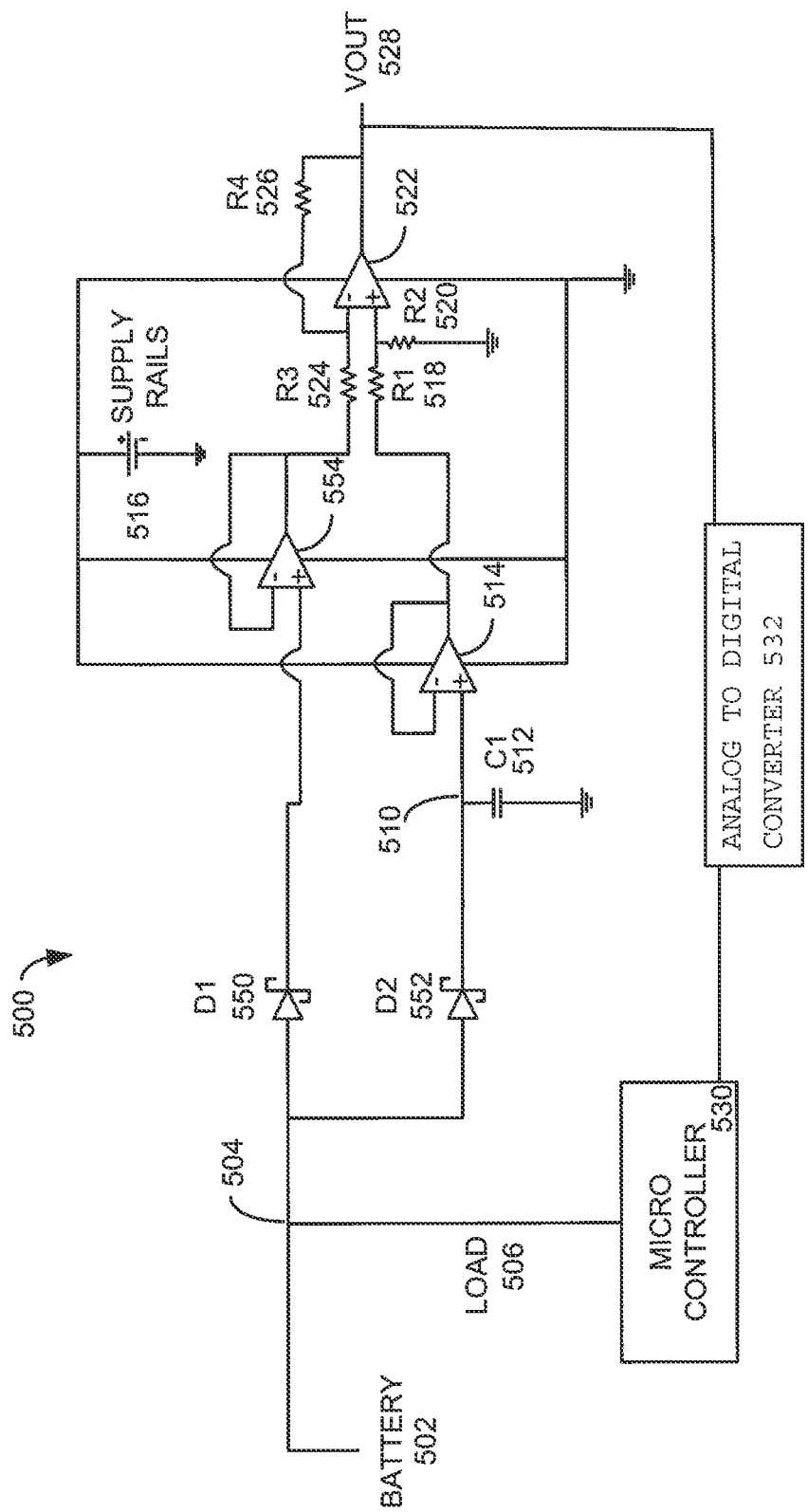
FIG. 5 depicts a second embodiment for a end of life battery detection circuit utilizing matched diodes as a sampling switch.

FIG. 5 depicts a second embodiment for an end of life battery detection circuit including matched diodes as a sampling switch. The circuit shown in FIG. 5 is similar to the circuit described above with reference to FIG. 3. Thus, similar circuit components common to the circuits have similar numerical designations. For example, the capacitor (312, 512) of the circuits shown in FIGS. 3 and 5 have a similar numerical designation ending in "12."

As mentioned, several components of the circuit 500 of FIG. 5 are similar to the same as those discussed above with reference to FIG. 3. Thus, the circuit 500 includes a battery connection 502, a first node 504, a load 506, a second node 510, a capacitor 512, a first OPAMP 514, a second OPAMP 522, four resistors (518-526) and a supply source 516 arranged in a similar manner as circuit 300. Additionally, the circuit 500 of FIG. 5 also includes a first diode 550, a second diode 552 and a third OPAMP 554, arranged as described in more detail below.

The anode of the first diode 550 is connected to the first node 504 of the circuit 500. While shown as a Schottky diode, the first and second diodes may be any electrical device that has similar functionality as a Schottky diode. The cathode of the first diode 550 is electrically connected to the non-inverting input of a third OPAMP 554. Also, similar to the first OPAMP 514, the output of the third OPAMP 554 may be fed back to the inverting input of the OPAMP, with the negative power supply input connected to ground and the positive power supply input provided by the supply rails 516 of the device.

A second diode 552 may also be connected to the circuit 500. The anode of the second diode 552 may be connected to the first node 504 while the cathode may be connected to a second node 510. The other components of the circuit 500 are arranged in the same manner as described above with reference to FIG. 3.

Figure 6:
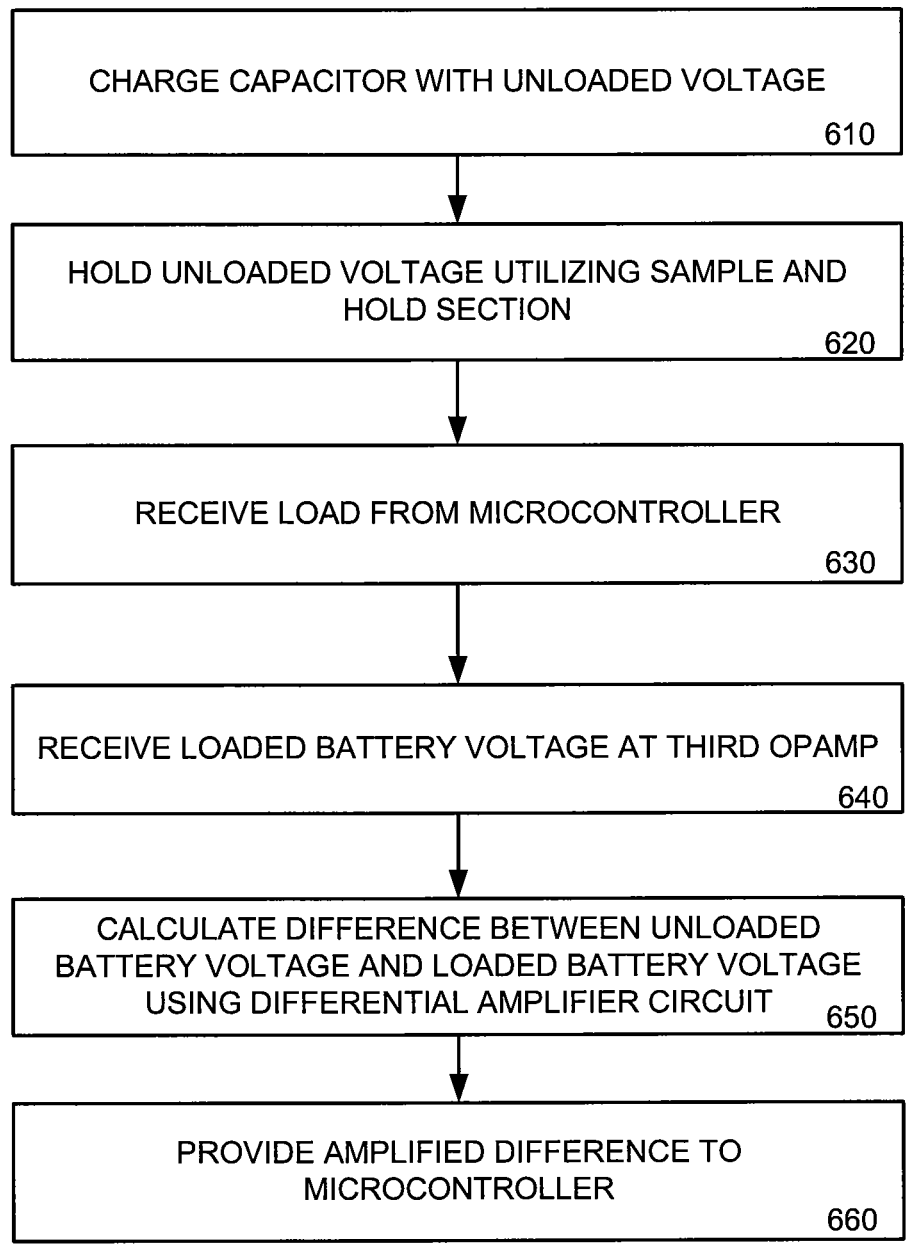
FIG. 6 is a flow chart showing a method for acquiring a voltage difference of a battery in a loaded and unloaded state utilizing the second embodiment.

To generate the amplified difference between the loaded and unloaded battery, the circuit 500 may operate in a manner as shown in FIG. 6. First, in operation 610, the second diode 552 may conduct when no load is present on the battery such that the capacitor 512 begins to charge with the voltage of the unloaded battery 502. In operation 620, this value may be held by the sample and hold section of the detection circuit 500 and provided as a first input to the differential amplifier section of the circuit. Next, in operation 630, a load may be provided to the circuit 500 by a microcontroller 530. Once loaded, the second diode 552 may cease conducting while the first diode 550 continues to conduct, providing the loaded voltage to the third OPAMP 554 to be held in operation 640. Both of the unloaded and loaded voltages are provided as inputs to the differential amplifier section of the circuit 500 from the respective OPAMPS. The differential amplifier may then measure and amplify the difference between the unloaded battery voltage and the loaded battery voltage in operation 650. The differential amplifier may then, in operation 660, provide the amplified difference between the loaded and unloaded battery to the microprocessor at the $V_{out}$ 528 of the circuit 500. This information may be digitized with an analog to digital converter 532 and used by the microprocessor to determine if the battery is near the end of life.

Figure 7:
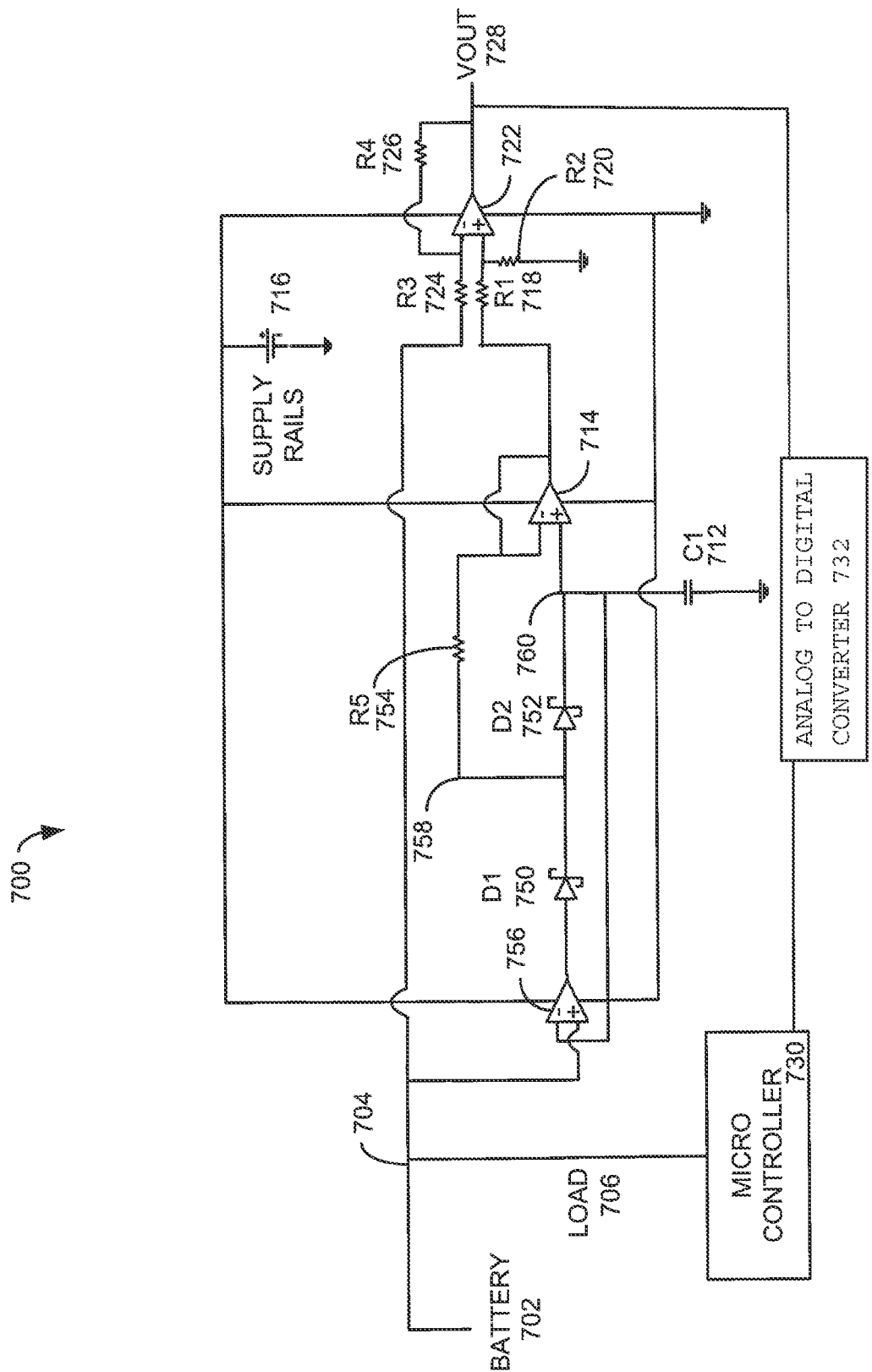
FIG. 7 depicts a third embodiment for a end of life battery detection circuit utilizing an active peak detector to hold the unloaded peak battery voltage.

FIG. 7 depicts a third embodiment for a end of life battery detection circuit including an active peak detector to hold the peak unloaded battery voltage. Again, the circuit shown in FIG. 7 is similar to the circuits described above with reference to FIGS. 3 and 5. Thus, similar circuit components common to the above-described circuits have similar numerical designations.

The circuit 700 of FIG. 7 includes many components similar to the components described above with reference to FIGS. 3 and 5. Thus, the circuit 700 includes a battery connection 702, a first node 704, a load 706, a capacitor 712, a first OPAMP 714, a second OPAMP 722, four resistors (718-726) and a supply source 716 arranged and functioning in a similar manner as in embodiments described above. Additionally, the circuit 700 of FIG. 7 also includes a first diode 750, a second diode 752, a fifth resistor 754, a sixth resistor 760 and a third OPAMP 756, arranged as described in more detail below.

Beginning at the first node 704, the non-inverting input to the third OPAMP 756 is connected to the first node. The output of the third OPAMP 756 is electrically connected to the anode of the first diode 750, with the cathode of the first diode is connected to a second node 758. Also connected to the second node is the anode of the second diode 752, with the cathode connected to a third node 760. The capacitor 712 of the circuit 700 is connected between the third node 760 and ground. The third node 760 is also connected to the inverting input to the third OPAMP 756.

The non-inverting input to the first OPAMP 714 is similarly connected to the third node 760. In addition, the output of the first OPAMP 714 is fed back to the inverting input of the first OPAMP. Connected between the inverting input of the first OPAMP 714 and the second node 758 is a fifth resistor 754.

The circuit 700 of FIG. 7 operates in a similar manner as the embodiment described in the flowchart of FIG. 6. Thus, the circuit 700 measures and holds the value of the unloaded battery at the output of the first OPAMP 714. To acquire the unloaded battery voltage, the third OPAMP 756, first diode 750, second diode 752, and the capacitor 712 operate as a active peak detector to hold the peak of the battery when it is unloaded. This peak value is provided to the differential amplifier of the circuit 700 as the output of the first OPAMP 714, similar to the embodiments described above. Thus, when the battery is unloaded, the active peak detector section of the circuit 700 samples the peak voltage of the battery and holds that value, providing it to the differential amplifier. When a load is applied to the battery by a microcontroller (at the load input 706), the loaded battery voltage is provided to the differential amplifier through the third resistor 724. The differential amplifier may then provide the amplified difference between the loaded and unloaded battery to the microprocessor at the Vout 728 of the circuit 700. This information may be digitized with an analog to digital converter 732 and used by the microprocessor 730 to determine if the battery is near the end of life.

It should be noted that the flowcharts of FIGS. 1, 4 and 6 are illustrative only. Alternative embodiments of the present invention may add operations, omit operations, or change the order of operations without affecting the spirit and scope of the present invention.

The foregoing merely illustrates certain principles and embodiments of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

The invention claimed is:

1. A circuit for detecting the end of life of a battery of an electronic device comprising:
   a first node electrically connected to a battery;
   a load intermittently electrically connected to the first node, the load configured to be applied and removed from the circuit;
   a sample and hold circuit electrically connected to the first node, the sample and hold circuit configured to sample and hold an unloaded battery voltage, the sample and hold circuit comprising:
     a capacitor electrically connected between a second node and ground;
     a first operational amplifier comprising an inverting input, a non-inverting input and an output, wherein the non-inverting input is electrically connected to the second node and the output is electrically connected to the inverting input; and
     a field effect transistor comprising a base terminal, a drain terminal, a gate terminal and a source terminal, wherein the base terminal and the source terminal are electrically connected to the first node and the drain terminal is electrically connected to the second node; and
   a differential amplifier electrically connected to the sample and hold circuit, the differential amplifier configured to calculate and amplify a difference between the sampled unloaded battery voltage and a loaded battery voltage.

2. The circuit of claim 1 further comprising:
   an analog to digital converter electrically connected to an output of the differential amplifier, the analog to digital converter configured to digitize the amplified difference between the sampled unloaded battery voltage and the loaded battery voltage; and
   a microcontroller configured to compare the digitized amplified difference with a predetermined threshold value.

3. The circuit of claim 1 further comprising:
   an enable input pin electrically connected to the gate terminal of the field effect transistor, wherein an enable signal is input on the enable input pin to control the flow of current through the field effect transistor and thereby control the charging of the capacitor.

4. The circuit of claim 3 wherein the enable signal and the load are controlled by a microcontroller.

5. The circuit of claim 1 wherein the differential amplifier comprises:
   a first resistor electrically connected between an output of the first operational amplifier and a non-inverting input of a second operational amplifier;
   a second resistor electrically connected to the non-inverting input of the second operational amplifier;
   a third resistor electrically connected between the first node and an inverting input of the second operational amplifier; and
   a fourth resistor electrically connected between an output of the second operational amplifier and the inverting input of the second operational amplifier.

6. A method for detecting the end of the life of a battery of an electronic device comprising:
   sampling a voltage of a battery while the battery is unloaded using a sample and hold circuit that comprises:
     a capacitor electrically connected between a second node and ground;
     a first operational amplifier comprising an inverting input, a non-inverting input and an output, wherein the non-inverting input is electrically connected to the second node and the output is electrically connected to the inverting input; and
     a field effect transistor comprising a base terminal, a drain terminal, and a source terminal, wherein the base terminal and the source terminal are electrically connected to a first node that is electrically connected to a battery and the drain terminal is electrically connected to the second node;
   storing the sampled unloaded battery voltage using the capacitor in the sample and hold circuit;
   measuring a voltage of the battery while a load is applied to the battery;
   calculating a difference between the sampled unloaded battery voltage and the measured loaded battery voltage;
   amplifying the calculated difference using a differential amplifier circuit; and
   comparing the amplified difference to a predetermined value to detect the end of the life of the battery.

7. The method of claim 6 further comprising:
   digitizing the amplified difference with a analog to digital converter prior to comparing the amplified difference to the predetermined value.

8. A system for detecting the end of the life of a battery of an electronic device comprising:
   a sample and hold circuit configured to sample the unloaded voltage of a battery, the sample and hold circuit comprising:
     a capacitor electrically connected between a second node and ground;
     a first operational amplifier comprising an inverting input, a non-inverting input and an output, wherein the non-inverting input is electrically connected to the second node and the output is electrically connected to the inverting input; and
     a field effect transistor comprising a base terminal, a drain terminal, and a source terminal, wherein the base terminal and the source terminal are electrically connected to a first node that is electrically connected to a battery and the drain terminal is electrically connected to the second node;
   a differential amplifier circuit configured to receive the sampled unloaded battery voltage from the sample and hold circuit and calculate and amplify a difference between the sampled unloaded battery voltage and a loaded battery voltage; and
   a microcontroller configured to receive the amplified difference from the differential amplifier and compare the amplified difference with a predetermined threshold value.

9. The system of claim 8 further comprising:
   an analog to digital converter configured to receive the amplified calculated difference and digitize the received difference.

10. The system of claim 9 wherein the microcontroller is further configured to provide an enable signal to activate the sample and hold circuit and apply a load to battery.

* * * * *